USO05733818A

United States Patent [19]
Goto

[11] Patent Number: 5,733,818
[45] Date of Patent: Mar. 31, 1998

[54] METHOD FOR FABRICATING SEMICONDUCTOR DEVICE WITH PLANARIZATION STEP USING CMP

[75] Inventor: Yoshiro Goto, Tokyo, Japan

[73] Assignee: NEC Corporation, Tokyo, Japan

[21] Appl. No.: 734,025

[22] Filed: Oct. 18, 1996

[30] Foreign Application Priority Data

Oct. 18, 1995 [JP] Japan ................................. 7-269893

[51] Int. Cl.[6] ................................................ H01L 21/265
[52] U.S. Cl. ............................................ 438/692; 438/699
[58] Field of Search ........................... 437/228, 228 PL, 437/235; 156/345; 438/692, 699

[56] References Cited

U.S. PATENT DOCUMENTS

| | | | |
|---|---|---|---|
| 4,732,658 | 3/1988 | Lee | 437/228 |
| 4,753,898 | 6/1988 | Parrillo et al. | 437/44 |
| 4,962,063 | 10/1990 | Maydan et al. | 437/228 |
| 5,101,251 | 3/1992 | Wakamiya et al. | 357/23.6 |
| 5,204,288 | 4/1993 | Marks et al. | 437/228 |
| 5,431,769 | 7/1995 | Kisakibaru et al. | 156/345 |
| 5,531,834 | 7/1996 | Ishizuka et al. | 118/723 |
| 5,554,570 | 9/1996 | Meada et al. | 437/235 |
| 5,556,501 | 9/1996 | Collins et al. | 156/345 |
| 5,571,576 | 11/1996 | Qian et al. | 427/554 |
| 5,602,056 | 2/1997 | Jain et al. | 437/238 |

OTHER PUBLICATIONS

Wolf, Stanley "Silicon Processing For the VLSI Era Volume 2:, Process Integration", Lattice Press, pp. 237–239, Month Unknown, 1990.

Wolf, et al, "Silicon Processing For the VLSI Era Volume 1 Process Technology", Lattice Press, pp. 182–187, Month Unknown, 1986.

Katsuyuki Machida et al., "Improvement of Water–Related Hot–Carrier Reliability by Using ECR Plasma–SiO$_2$", *IEEE Transactions on Electron Devices*, vol. 41, No. 5, May 1994, pp. 709–714.

*Primary Examiner*—John Niebling
*Assistant Examiner*—Michael S. Lebentritt
*Attorney, Agent, or Firm*—Sughrue, Mion, Zinn, Macpeak & Seas, PLLC

[57] ABSTRACT

A semiconductor device is fabricated by steps of forming, by atmospheric pressure CVD or low pressure CVD without using plasma, a first insulating layer that covers a semiconductor substrate having a protruded and recessed surface; forming, by bias plasma CVD using an electron cyclotron resonance process, a second insulating film that covers the first insulating layer; and planarizing the second insulating film by a CMP process. In this way, the time required for planarizing a surface of the semiconductor substrate by the CMP can be reduced.

5 Claims, 5 Drawing Sheets

METHOD FOR FABRICATING SEMICONDUCTOR DEVICE WITH PLANARIZATION STEP USING CMP

BACKGROUND OF THE INVENTION

1. Field of the Invention

The present invention relates to a method for fabricating a semiconductor device, and more particularly to a method for fabricating a semiconductor device in which an interlayer insulating film is planarized.

(2) Description of the Related Art

In recent years, a large number of ultra-small elements such as transistors are formed in a semiconductor substrate and, by using interlayer insulating films covering these ultra-small elements, they are electrically and spatially separated from interconnections interconnecting other individual elements. However, since protrusions and recesses are formed by the elements and interconnections on the semiconductor surface, the interlayer insulating film formed thereon also has protrusions and recesses. Since the interconnections are formed on the interlayer insulating films, techniques which are capable of planarizing the interlayer insulating films in such a way as to facilitate the patterning of the interconnections and prevent the breakage of the interconnections occurring at stepped portions are attracting attention. As techniques for planarizing interlayer insulating films, a reflow and a CMP (Chemical Mechanical Polishing) are available. In recent years, the CMP is especially attracting attention for the reason that the planarization precision therein is higher.

U.S. Pat. No. 4,755,478 discloses a method for planarizing an interlayer insulating film by CMP. When this method is applied to a semiconductor substrate after the formation of a MOS transistor, the interlayer insulating film, as shown in FIG. 1, is formed by atmospheric pressure CVD or low pressure CVD thereby covering the MOS transistor and the semiconductor substrate. Protrusions 108 on the interlayer insulating film 107 are polished and removed by the CMP for planarization. Here, the MOS transistor is formed on an N-type substrate 106 and has a gate electrode 101, a gate insulating film 102, a P-type source/drain region 103, an N-type source/drain region 109, and an P-type well 105. The P-channel MOS transistor and the N-channel MOS transistor are isolated from each other by an element isolation region 104.

When the interlayer insulating film 107 is formed by atmospheric pressure CVD or low pressure CVD processes without using plasma, the interlayer insulating film forms protrusions 108 which extend over a large area as shown in FIG. 1 so that it inevitably requires an extended time for the polishing of the protrusions 108 by the CMP for the planarization of the interlayer insulating film.

SUMMARY OF THE INVENTION

An object of the invention, therefore, is to overcome the problems existing in the prior art, and to provide a method for fabricating a semiconductor device, which is capable of reducing the amount of the silicon oxide film to be polished and removed by the CMP and the time required for the planarization of interlayer insulating films.

According to one aspect of the invention, there is provided a method for fabricating a semiconductor device comprising the steps of:

forming, by one of atmospheric pressure CVD and low pressure CVD without using plasma, a first insulating layer that covers a semiconductor substrate having a protruded and recessed surface;

forming, by bias plasma CVD using an electron cyclotron resonance process, a second insulating film that covers the first insulating layer; and planarizing the second insulating film by a CMP process.

The second insulating film may be formed by silicon oxide.

According to the invention, since a thin silicon oxide film is formed by atmospheric or low pressure CVD on an element without using plasma, followed by the formation of a planarization silicon oxide film by the bias plasma CVD utilizing the ECR, it is possible to reduce the time required for the CMP that is carried out for the planarization of a surface of the substrate. This can reduce the fabrication time thus enabling the reduction of costs in the fabrication.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the drawings.

FIGS. 2A to 2H are for use in explaining a method for fabricating a semiconductor device of a first embodiment according to the invention.

Figure 2A:
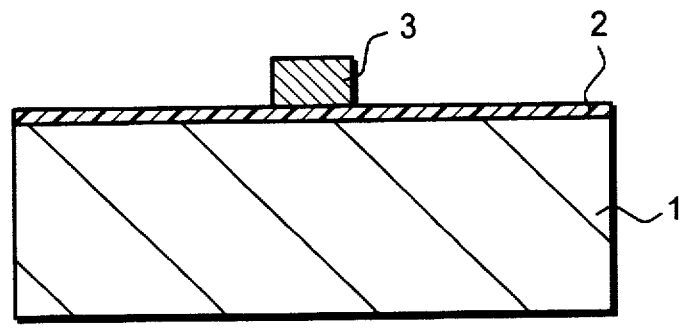
FIGS. 2A–2H are structural sectional diagrams for use in explaining sequential steps in the method for fabricating the MOS transistor of a first embodiment according to the invention.

As shown in FIG. 2A, a silicon oxide film 2 is formed by a thermal oxidation method as a gate oxide film on a P-type silicon substrate 1. Then, on this gate oxide film, a gate electrode 3 constituted by a polycrystalline silicon is selectively formed.

Figure 2B:
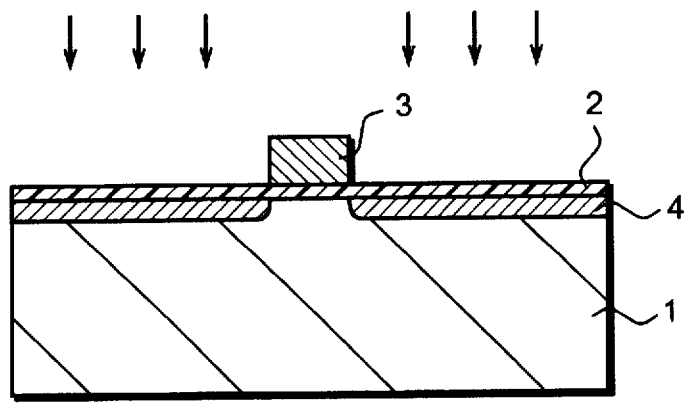

Next, for forming a Lightly Doped Drain (LDD) layer as shown in FIG. 2B, an N-type impurity, for example, phosphorus, is ion-implanted. Thus, at a source/drain formation region of a MOS transistor, an $N^-$-type impurity layer 4 to become the LDD layer with a low donor concentration is formed.

Figure 2C:
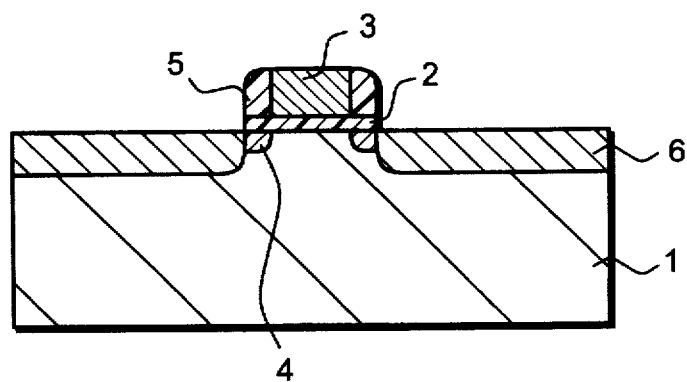

Then, a silicon oxide film is grown by a thermal oxidation method on the entire surface of the P-type silicon substrate 1, and this silicon oxide film is anisotropically etched, whereby sidewalls 5 are formed at sides of the gate electrode 3 as shown in FIG. 2C.

Figure 2D:
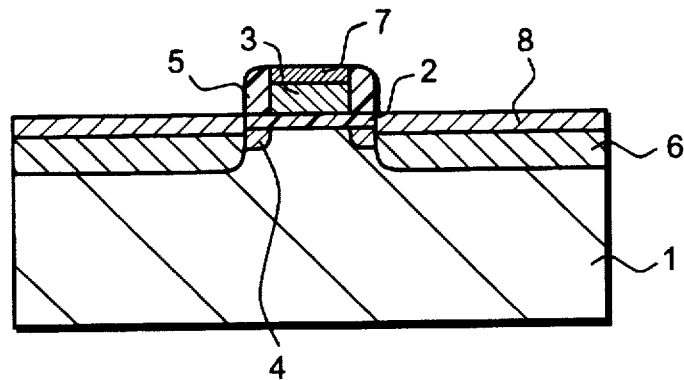

Thereafter, for the formation of a source/drain diffusion layer, an N-type impurity, for example, arsenic As, is ion implanted, whereby an $N^+$-type impurity region 6 having a high donor concentration is formed at a source/drain diffusion layer formation region. Then, a thermal process is carried out and the implanted impurity is activated. Further, a thin film of titanium Ti is formed on the entire surface of the silicon substrate 1 followed by a thermal process. Through this thermal process, silicon Si and titanium Ti are reacted thereby forming titanium silicide $TiSi_2$. When the titanium Ti that has not undergone the silicidation reaction is selectively etched away, there is formed titanium silicide $TiSi_2$ 7 as shown in FIG. 2D on the gate electrode 3 and a source/drain electrode 8 on the surface of the silicon substrate 1. The processes thus far described are known so that the conditions such as pressure, temperature, material, etc. are not explained.

Figure 2E:
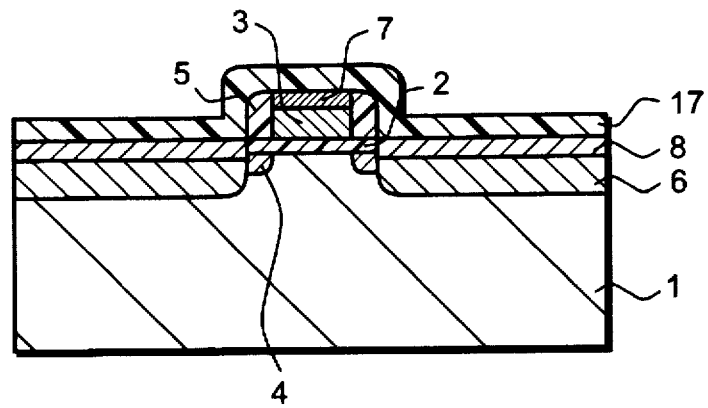

On the entire surface of such elements as MOS transistors formed as above and of the silicon substrate 1, a silicon oxide film as a protective film 17 as shown in FIG. 2E is grown to about 1000 to 1500 Angstroms by atmospheric pressure CVD or low pressure CVD at about 400° C. using silane $SiH_4$ and oxygen $O_2$ as source gases.

Figure 2F:
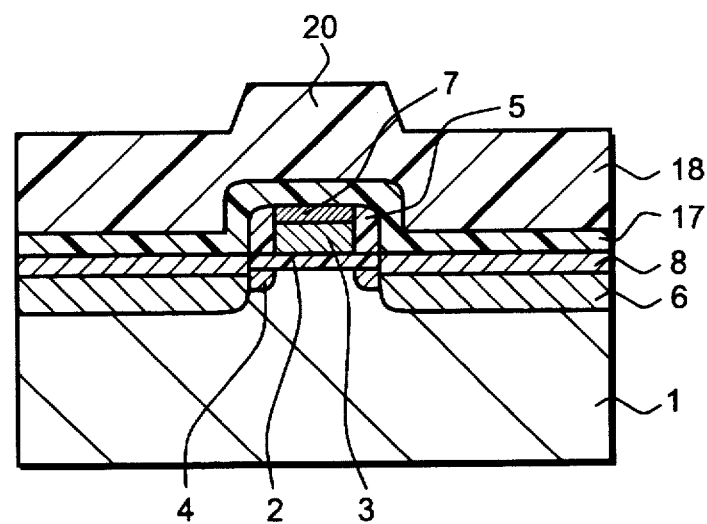

Thereafter, by a bias plasma CVD process using an ECR (Electron Cyclotron Resonance) plasma, a silicon oxide film 18 as shown in FIG. 2F is grown to about 8000 to 10000 Angstroms with silane $SiH_4$ and oxygen $O_2$ used as source gases and with the conditions of the gas pressure being about 1 mTorr, the radio frequency (RF) power being about 800 W, and the RF power density being 1 $W/cm_2$.

Figure 1:
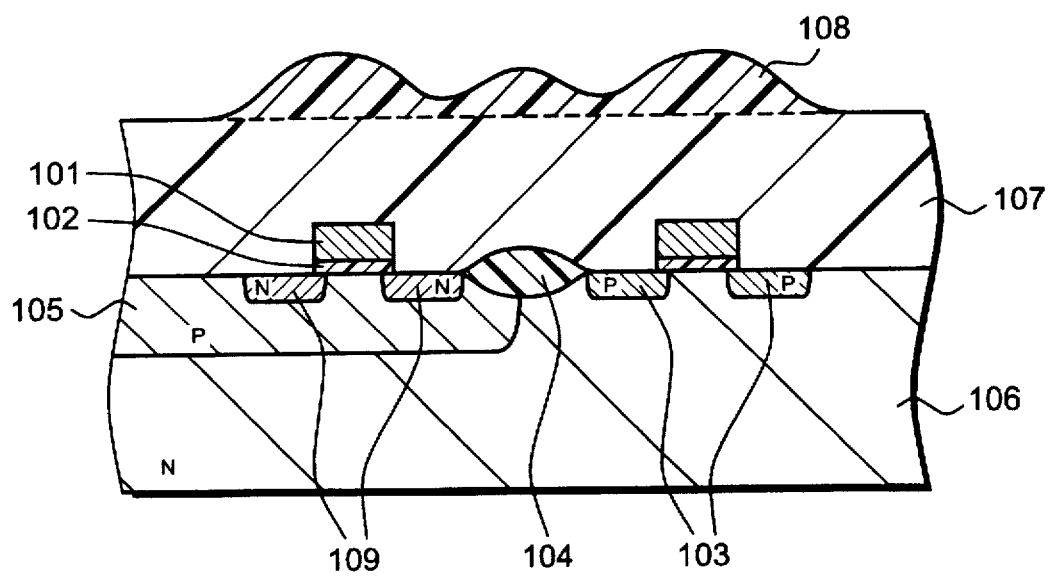
FIG. 1 is a structural sectional diagram for use in explaining a conventional method for forming an interlayer insulating film on a MOS transistor.

Now, explanation is made for differences between the case wherein the silicon oxide film is formed through the atmospheric pressure CVD or the low pressure CVD which does not utilize the plasma and the case wherein the silicon oxide film is formed by the bias plasma CVD utilizing the ECR plasma.

Where the silicon oxide film is formed by the atmospheric pressure CVD or the low pressure CVD without using the plasma, the silicon oxide film protrudes over a large area as shown in FIG. 1 thereby forming large protrusions 108. On the other hand, where the silicon oxide film 17 as shown in FIG. 2F is formed by the bias plasma CVD using the ECR plasma as according to the present invention, only a limited portion of an upper part of the silicon oxide film 17 that covers the gate electrode results in a protrusion 20 of a triangular or trapezoidal shape, which is a characteristic of the bias plasma CVD. This is because, in the bias plasma CVD utilizing the ECR plasma, the film is formed as the etching progresses. Thus, the width of the protrusion formed on an element by the bias plasma CVD using the ECR plasma results in a width narrower than the width of the element after the etching, and this characteristic cannot be attained by other plasma CVD processes that are available today. The volume of the protrusion that requires polishing is very small so that the time required for the CMP process to follow can be reduced. However, in the bias plasma CVD utilizing the ECR, since the film formation progresses as the plasma is generated, it is not possible to form a silicon oxide film directly on the element formed, such as a MOS transistor. This is because the high frequency plasma gas generated by the bias plasma CVD hits the substrate thereby causing the gate electrode to be charged up by electron charged particles and also the gate oxide film to be trapped by electron charged particles, thus resulting in deviations of the threshold of the transistor and leading to the likelihood of the gate oxide film to be damaged by the electric field between the electron charged gate electrode and the reverse biased substrate. Under such a state, it is not possible to uniformly determine the threshold of the MOS transistor and the breakdown voltage of the gate oxide film, thus making it impossible to obtain the MOS transistor that satisfies the required design values.

Therefore, according to the invention, in order to prevent the trapping in the gate oxide film 2 and the charging up of the gate electrode 3, a silicon oxide film of about 1000–1500 Angstroms is first formed on an element by atmospheric pressure CVD or low pressure CVD without using plasma as explained above, and this silicon oxide film is used as a protective film 17 for the prevention of the charging up and the trapping. The silicon oxide film thus formed by atmospheric pressure CVD and low pressure CVD is required to be formed to such a thickness that allows it to function as the protective film. If this silicon oxide film 17 is thick, a silicon oxide film (interlayer insulating film) 18 formed thereon by the bias plasma CVD results in having a large breadth at its protrusion 20. Thus, it is necessary that the silicon oxide film 17 be formed sufficiently thin so as to be able to function as the protective film. In practice, the silicon oxide film formed by atmospheric pressure CVD or low pressure CVD has poor coverage, and thus does not permit this film to be formed thick.

Figure 2G:
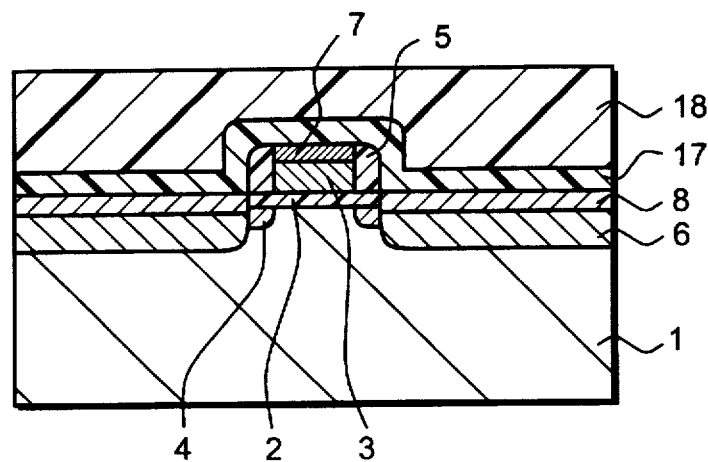

Thereafter, when a silicon oxide film of 8000–10000 Angstroms is formed as the interlayer insulating film 18 by the bias plasma CVD utilizing ECR plasma, the protective film 17 protects the gate insulating film 2 and the gate electrode 3 from the plasma thereby preventing the charging up and the trapping. Also, as already explained, as a characteristic of the bias plasma CVD, only a limited portion above the element forms a protrusion of a triangular or trapezoidal shape, so that the total amount of the protrusion 20 of the silicon oxide film which is to be polished and removed becomes very small. The interlayer insulating film 18 thus formed by the bias plasma CVD utilizing the ECR plasma is planarized as shown in FIG. 2G.

Figure 2H:
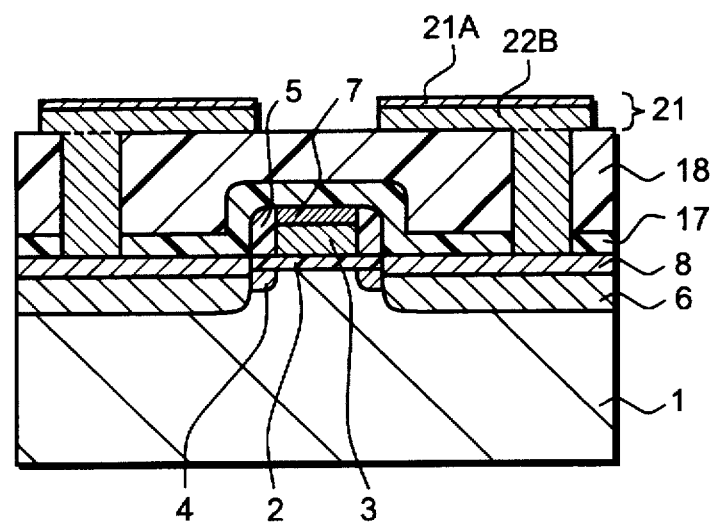

Then, by using a selectively formed photoresist as a mask, a dry etching process is carried out with $CHF_3$ and $CF_4$ gas being diluted by an argon Ar gas and the conditions of the pressure being about 500 mTorr and the RF power being 800 W, whereby a contact hole is selectively formed on a region above the source/drain region as shown in FIG. 2H. Thereafter, a tungsten W layer of 5000 Angstroms is grown over the entire surface, and is etched back thereby forming a plug of tungsten only in the contact hole. Further, an AlSiCu layer of about 4000–8000 Angstroms is formed by sputtering as an interconnection 21B, and also a titanium nitride TiN layer 21A of about 500 Angstroms is formed by sputtering for the prevention of reflection. Then, the TiN/AlSiCu layer is dry-etched with the interconnection portion being masked using a photoresist, whereby a metal interconnection 21 is formed. In this way, the processes for forming the interlayer insulating film 18 over the element and for forming the metal interconnection 21 on the upper surface thereof are completed.

Figure 3:
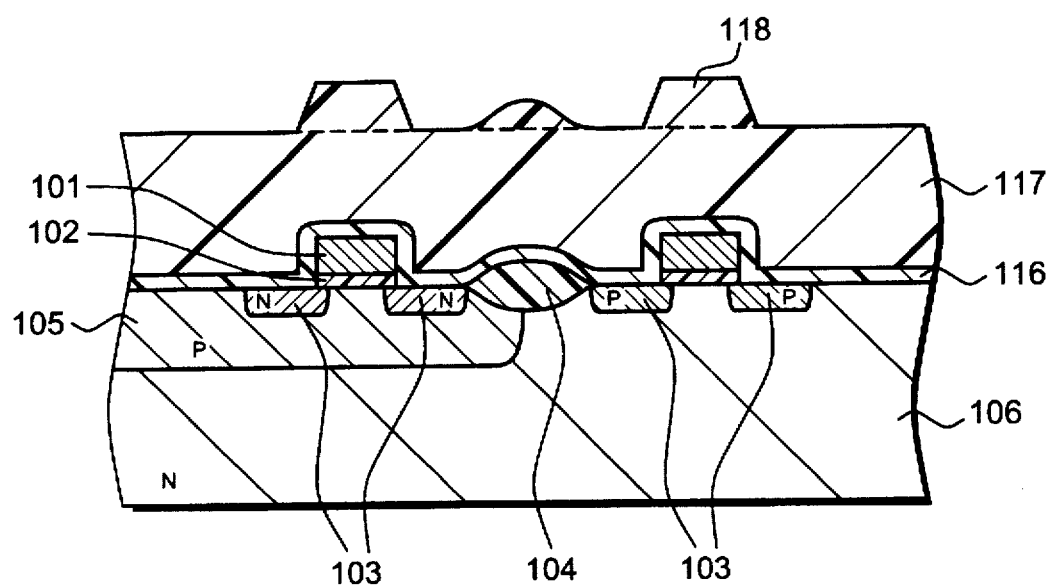
FIG. 3 is a structural sectional diagram for use in explaining a method for forming an interlayer insulating film on a MOS transistor of a second embodiment according to the invention.

FIG. 3 diagrammatically shows a semiconductor device of a second embodiment according to the invention. The illustration in FIG. 3 corresponds to that of the prior art example shown in FIG. 1, and the same reference numerals refer to the same or similar elements. The portions which are different in this embodiment from the prior art are that a protective film 116 is provided so as to cover a surface of the substrate 106 and the gate electrode 101 as well as the element isolation region 104 by low pressure or atmospheric pressure CVD without using plasma, and an interlayer insulating film 117 is formed so as to cover the protective film 116 by the plasma CVD utilizing the ECR. Here, the portions of the interlayer insulating film 117 that correspond to the gate electrode 101 and the element isolation region 104 which protrude from the substrate are formed as protrusions 118 protruding from the interlayer insulating film 117. However, as already explained, because of the characteristics of the interlayer insulating film formed by the plasma CVD utilizing the ECR, the protrusions 118 are formed smaller than the protrusions defined by the protective film 116 which covers the gate electrode 101 and the element isolation region 104. Therefore, the time required for the planarization using the CMP is reduced, resulting in the reduction in fabrication costs.

It has been confirmed that, as a result of the formation of the interlayer insulating film by the bias plasma CVD utilizing the ECR, the time required for the CMP polishing and removal of the silicon oxide film formed by atmospheric pressure CVD or low pressure CVD is about two times the time required for the CMP polishing and removing of the silicon oxide film formed by the bias plasma CVD utilizing the ECR. That is, when the method according to the present invention is applied, the CMP step can be completed in half the time that is required in the prior art method. Especially, since the transition from the low pressure CVD to the plasma CVD utilizing the ECR is carried out, with almost no change in the pressure, by adding argon Ar gas to a material gas $SiH_4$ and $O_2$ and applying the RF power of about 800 W and the RF power with a density of about 1 $W/cm^2$, there is no need to add any new step for the transition from the formation of the insulating layer 17 (116) to the formation of the interlayer insulating film 18 (117), thus eliminating any extra time. Thus, when the method according to the present invention is applied, the time required for the CMP step can be reduced to half the time required in the prior art method.

In the method according to the invention, the silicon oxide film is used as the interlayer insulating film formed by the bias plasma CVD for the reason that a good coverage is obtained thereby. However, even though a similarly good coverage may be obtained when a PSG (Phospho-Silicate Glass) film containing phosphorus or a BPSG (Boron Phospho-Silicate Glass) containing phosphorus or boron is used, such a film cannot be replaced for the interlayer insulating film as obtained by the method according to the invention. This is because, when the interlayer insulating film employs the PSG or BPSG, the hot carrier resistance property of a MOS transistor suffers resulting in a deterioration of the life time of the MOS transistor. It is considered that this problem results from the water contained in the PSG and BPSG. Thus, where the PSG or BPSG is to be used in the formation of the interlayer insulating film, a silicon nitride film which excels in water proof properties may first be formed on the silicon oxide film formed on a semiconductor substrate and, on this silicon nitride film, a PSG or BPSG film may be formed followed by a CMP process. However, in such a case, although the PSG or BPSG film can be formed by atmospheric pressure CVD or low pressure CVD, the additional step that is needed for the formation of the silicon nitride film is required. Further, it is apparent that a silicon oxide film formed by bias plasma CVD utilizing an ECR may be used instead of the PSG or BPSG.

In explaining the invention, the MOS transistor is referred to as an example of the element. However, this element does not have to be limited to the MOS transistor since the same effect can be obtained in other elements which have protrusions on a semiconductor substrate thereof. Further, although the silicon oxide film was formed, as a protective film against plasma on the element, by using atmospheric pressure CVD or low pressure CVD without using plasma, it is apparent that this protective film does not have to be the silicon oxide film since any film that is usable for protection against plasma can appropriately be selected as a material for the protective film.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. A method for fabricating a semiconductor device comprising the steps of:

forming, by one of atmospheric pressure CVD and low pressure CVD without using plasma, a first insulating layer that covers a semiconductor substrate;

forming, by bias plasma CVD using an electron cyclotron resonance process, a second insulating film that covers said first insulating layer; and planarizing said second insulating film by a CMP process.

2. A method for fabricating a semiconductor device comprising the steps of:

forming a first MOS transistor having a first gate electrode formed as a protrusion at a first region on a semiconductor substrate;

forming a second MOS transistor having a second gate electrode formed as a protrusion at a second region on said semiconductor substrate;

forming a first insulating film provided between said first region and said second region for isolating said first MOS transistor and said second MOS transistor from each other;

forming, by one of atmospheric pressure CVD and low pressure CVD without using plasma, a second insulating film covering said first region and said second region as well as said semiconductor substrate;

forming, by a bias plasma CVD using an electron cyclotron resonance process, a third insulating film that covers said second insulating layer; and planarizing said third insulating film by a CMP process.

3. A method for fabricating a semiconductor device according to claim 1, in which said second insulating film is formed by silicon oxide.

4. A method for fabricating a semiconductor device according to claim 2, in which said third insulating film is formed by silicon oxide.

5. A method for fabricating a semiconductor device comprising the steps of:

forming, by one of atmospheric pressure CVD and low pressure CVD without using plasma, a first insulating layer that covers a semiconductor substrate having a surface from which a plurality of gate electrodes and an element isolation region protrude;

forming, by bias plasma CVD using an electron cyclotron resonance process, a second insulating film that covers said first insulating layer, wherein said second insulating film has a surface on which a plurality of small protrusions are formed, and wherein a width of said plurality of small protrusions above said surface of said second insulating film is narrower than a width of protrusions formed by said plurality of gate electrodes and said element isolation region disposed on said semiconductor substrate and covered by said first insulating layer; and planarizing said plurality of small protrusions formed on said second insulating film by a CMP process.

* * * * *